(12) United States Patent
Takehara

(10) Patent No.: US 6,320,524 B1
(45) Date of Patent: Nov. 20, 2001

(54) R/D CONVERTER

(75) Inventor: Takao Takehara, Ota-ku (JP)

(73) Assignee: Minebea Co., Ltd., Nagano-ken (JP)

( * ) Notice: Subject to any disclaimer, the term of this patent is extended or adjusted under 35 U.S.C. 154(b) by 0 days.

(21) Appl. No.: 09/471,390

(22) Filed: Dec. 23, 1999

(30) Foreign Application Priority Data

May 31, 1999 (JP) ................................................. 11-150986

(51) Int. Cl.⁷ .................................................... H03M 1/48
(52) U.S. Cl. ............................................. 341/116; 318/632
(58) Field of Search ..................................... 341/111, 110, 341/115, 116, 117, 118, 112; 364/559; 318/632, 608, 605

(56) References Cited

U.S. PATENT DOCUMENTS

| | | | |
|---|---|---|---|
| 4,486,845 | * 12/1984 | Duckworth | 364/559 |
| 4,857,926 | * 8/1989 | Neglia et al. | 341/116 |
| 4,933,674 | * 6/1990 | Gasperi et al. | 341/116 |
| 4,989,001 | * 1/1991 | Serev | 341/116 |
| 5,162,798 | * 11/1992 | Yundt | 341/116 |
| 5,455,498 | * 10/1995 | Kakimoto et al. | 318/605 |
| 5,646,496 | * 7/1997 | Woodland et al. | 318/632 |
| 5,796,231 | * 8/1998 | Kyodo | 318/608 |

* cited by examiner

*Primary Examiner*—Brian Young
*Assistant Examiner*—John Nguyen
(74) *Attorney, Agent, or Firm*—Oliff & Berridge, PLC

(57) ABSTRACT

There is provided an R/D converter which can make high speed response. When a sine-wave for excitation of a resolver has a positive (or negative) maximum value, an AD converter performs AD conversion of sine-wave output and cosine-wave output of the resolver and makes input to an FPGA. The FPGA calculates on the basis of the input data, and outputs an obtained digital value to a DA converter and the like. Since the FPGA calculate the rotor shaft angle, as compared with the prior art (R/D converter of a tracking system) for performing a kind of PLL control including a close loop made up of a demodulator circuit, a voltage controlled oscillator, and the like, it becomes possible to perform rotor shaft angle calculation at higher speed, and by this, the high speed response can be made. Since the rotor shaft angle is obtained through digital operation, a compensation circuit for temperature drift which has been required in the prior art becomes unnecessary, and by that, the total structure becomes simple, and the cost can be made low.

7 Claims, 4 Drawing Sheets

R/D CONVERTER

BACKGROUND OF THE INVENTION

1. Field of the Invention

The present invention relates to a converter for digitizing the output of a resolver (hereinafter referred to as R/D converter).

2. Description of the Related Art

A resolver is a kind of rotary transformer, and includes two stator windings and one rotor winding. The two stator windings are mechanically disposed at an angle of 90 degrees. The amplitude of a signal obtained by magnetic coupling to the stator windings becomes a function of relative position between the position of the rotor (shaft) and the stator. Thus, two kinds of output voltages (S3–S1, S4–S2), which are modulated by a sine (sine wave) and a cosine (cosine wave) of a shaft angle and are expressed by the following equations (1) and (2), are obtained. Although equation (5) indicates a signal of a resolver format, the signal of the resolver format is based on a signal [output voltages (S3–S1) and (S4–S2)] obtained from the resolver output.

$$S3-S1 = E_0 \sin\omega t \sin\theta \quad (1)$$

$$S4-S2 = E_0 \sin\omega t \cos\theta \quad (2)$$

Where, $\theta$ is an axial angle, $\omega$ is an angular velocity corresponding to a rotor excitation frequency (f), and $E_0$ is an rotor excitation amplitude.

Here, using AD2S90 of Analog Device Company as an example, a conventional resolver digital converter (R/D converter 1) of a tracking system will be described.

FIG. 5 is a functional block diagram of the AD2S90.

In FIG. 5, when a transducer (rotor of the resolver) (not shown) passes through a position equivalent to a least significant bit, the output (output of a serial interface) is renewed by one LSB. Renewal of CLKOUT corresponds to increase of one LSB.

When the present word state of an up down counter 2 is made $\phi$, the output voltage (S3–S1) is multiplied by $\cos\phi$ through a sine cosine multiplier 3, and the output voltage (S4–S2) is multiplied by $\sin\phi$, whereby signals expressed by the following equations (3) and (4) are obtained.

$$E_0 \sin\omega t \sin\theta \cos\phi \quad (3)$$

$$E_0 \sin\omega t \cos\theta \sin\phi \quad (4)$$

The signals expressed by the equations (3) and (4) are subtracted through an error amplifier 4, whereby a signal expressed by the following equation (5) is obtained.

$$E_0 \sin\omega t (\sin\theta\cos\phi - \cos\theta\sin\phi) = E_0 \sin\omega t \sin(\theta-\phi) \quad (5)$$

Where, $(\theta-\phi)$ is an angular error.

A demodulator circuit 5 and an integrator 6 are connected to an output side of the error amplifier 4, and a voltage controlled oscillator (VCO) 7 is connected to the demodulator circuit 5 and the integrator 6. Then, the demodulator circuit 5, the integrator 6, and the VCO 7 form a close loop, which operates in such a manner that $\sin(\theta-\phi)$ [see the equation (5)] is made zero. When this operation is realized, the word state $\phi$ of the up and down counter 2 connected to the sine cosine multiplier 3 becomes equal to the resolver shaft angle $\theta$.

However, in the foregoing R/D converter 1 of the tracking system shown in FIG. 5, attention has not been paid in the following points.

(a) Since it is a kind of PLL control, response speed is low. Particularly, as resolution becomes high, the response speed becomes low.

(b) It is necessary to compensate temperature drift of the analog operating circuit (the sine cosine multiplier 3, the demodulator circuit 5 and the like), so that its IC circuit becomes complicated and expensive.

(c) If an interface cable between the resolver (not shown) and the R/D converter 1 becomes long, a phase becomes large because of delay between the exciting sine wave and the sine-wave output and cosine-wave output of the resolver, and an angular error becomes large.

SUMMARY OF THE INVENTION

The present invention has been made in view of the above circumstances, and an object of the invention is to provide an R/D converter which enables high speed response. Another object of the invention is to eliminate temperature drift compensation and to make an apparatus inexpensive.

According to a first aspect of the invention, an R/D converter includes a gate array to which data obtained through AD conversion of sine-wave output and cosine-wave output of a resolver are inputted and has logical operation capability, and the gate array obtains a rotor shaft angle of the resolver by digital operation on the basis of the digital input data.

According to a second aspect of the invention, in the structure of the first aspect, the gate array inputs digital data for an excitation sine wave of the resolver to a DA converter, and the DA converter obtains the excitation sine wave of the resolver on the basis of the input data from the gate array.

According to a third aspect of the invention, in the structure of the second aspect, at a specific phase time of the excitation sine wave of the resolver, a sine-wave output signal and a cosine-wave output signal of the resolver are subjected to AD conversion, and the rotor shaft angle is calculated.

According to a fourth aspect of the invention, in the structure of any one of the first to third aspects, a quadrant to be formed by dividing an angular space of the resolver into two equal parts is obtained, the rotor shaft angle of the resolver in the quadrant is obtained on the basis of polarities of the sine-wave output and the cosine-wave output of the resolver, and an initial angle of a rotor shaft angle for calculating VCO is set at the center of the divided quadrant.

According to a fifth aspect of the invention, in the structure of the fourth aspect, a sine value corresponding to a difference between the rotor shaft angle of the resolver and an angle corresponding to an address of a sine-wave table is calculated, and an angle of the VCO is increased or decreased on the basis of size relation between the rotor shaft angle of the resolver and the angle of the VCO.

According to a sixth aspect of the invention, in the structure of the fifth aspect, the quadrant is set such that a value in the angular space becomes large from the left to the right, and in the quadrant, if the rotor shaft angle of the resolver exists right as compared with the angle of the VCO, the angle of the VCO is made to increment.

According to a seventh aspect of the invention, in the structure of the fifth aspect, the quadrant is set such that a value in the angular space becomes large from the left to the right, and in the quadrant, if the rotor shaft angle of the resolver exists left as compared with the angle of the VCO, the angle of the VCO is made to decrement.

According to an eighth aspect of the invention, in the structure of any one of the aspects 5 to 7, an AD conversion value of the sine-wave output of the resolver and a sine value of the angle of the VCO are compared with each other, an address corresponding to an angle of the sine-wave table is increased or decreased by one bit according to the rotor shaft angle in the quadrant, and an angle corresponding to the address is made to approach the rotor shaft angle.

DETAILED DESCRIPTION OF THE PREFERRED EMBODIMENT

Figure 1:
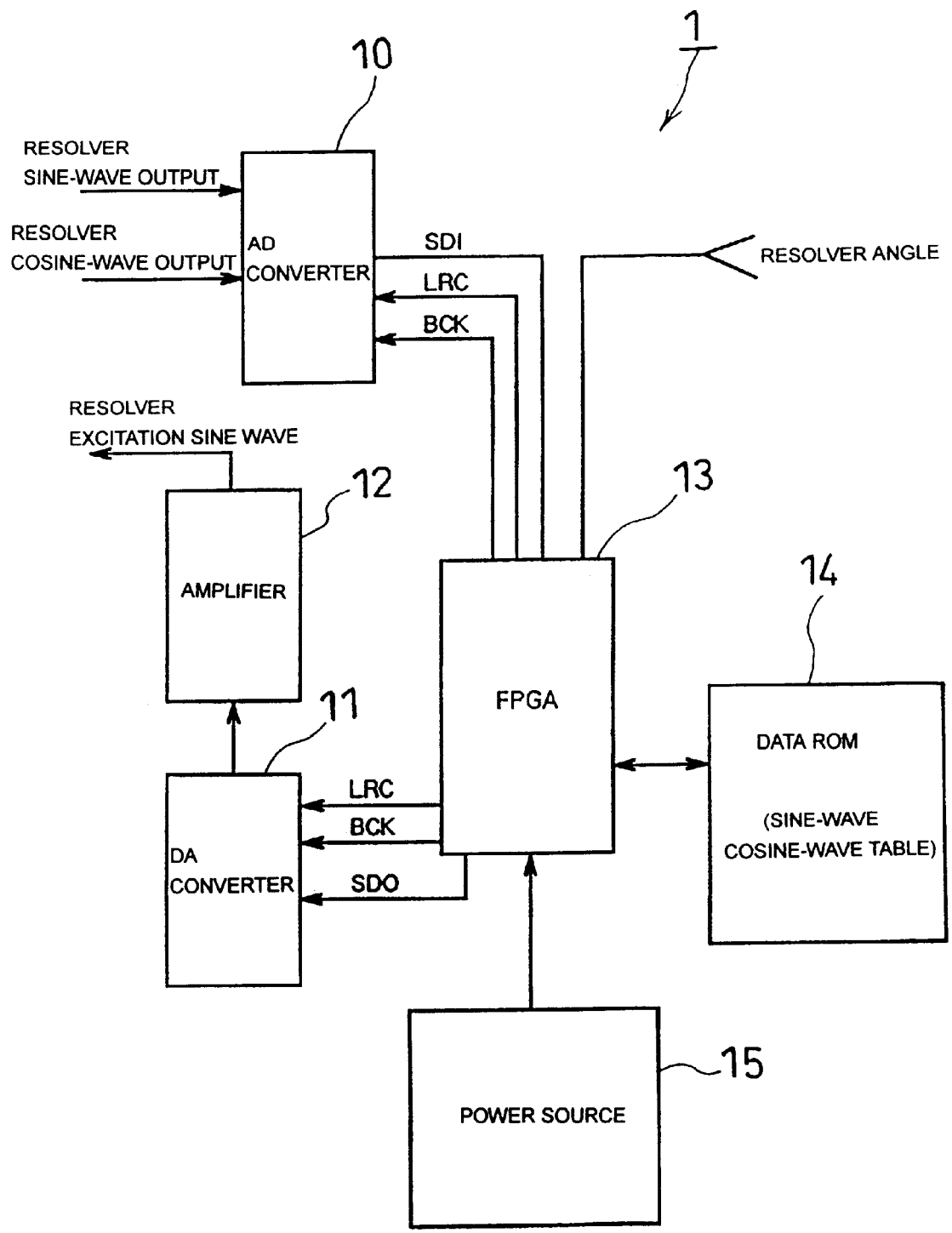
FIG. 1 is a block diagram showing an R/D converter of a first embodiment of the invention.

An R/D converter according to an embodiment of the present invention will be described below with reference to FIGS. 1 to 4. In FIG. 1, an R/D converter 1 is substantially made up of an AD converter 10 to which sine-wave output and cosine-wave output of a resolver (not shown) are inputted, a DA converter 11 for outputting an excitation sine wave for the resolver, an amplifier 12 which is provided between the resolver and the DA converter 11 and amplifies an output signal from the DA converter 11, an FPGA 13 (Field Programmable Gate Array) which is provided between the AD converter 10 and the DA converter 11 and is an example of a gate array, and data ROM 14 connected to the FPGA 13 and storing sine-wave and cosine-wave tables for calculation of a rotor shaft angle. In FIG. 1, reference numeral 15 designates a power source connected to the FPGA 13 and supplying electric power to the R/D converter 1.

As described above, the output (sine-wave output and cosine-wave output) of the resolver is inputted to the AD converter 10. The precision (resolution) of the AD converter 10 is provisionally made 16 bits.

The FPGA 13 outputs input data (word clock LRC, bit clock BCK, serial data SDO) to the DA converter 11, and calculates the rotor shaft angle of the resolver on the basis of the output data of the AD converter 10 (AD conversion output of the sine-wave output and cosine-wave output).

Next, a method of calculating an angle will be described with reference to FIGS. 2, 3 and 4.

Figure 2:
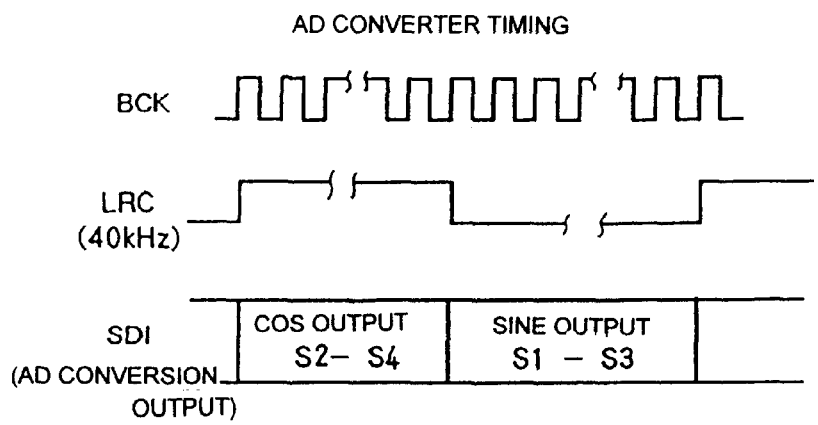
FIG. 2 is a view showing operation timing of an AD converter of FIG. 1.

FIG. 2 shows operation timing of the AD converter 10.

When a sampling frequency is made 10 KHz, a fourth frequency of the word clock LRC becomes the sampling frequency. When the resolution of the AD converter 10 is made 16 bits, the AD conversion output SDI of the sine-wave output and cosine-wave output of the resolver in one period of the wordclock LRC is outputted in a serial format to a serial port of the FPGA 13, and serial data are taken in the serial port at the leading edge of the bit clock BCK.

Figure 3:
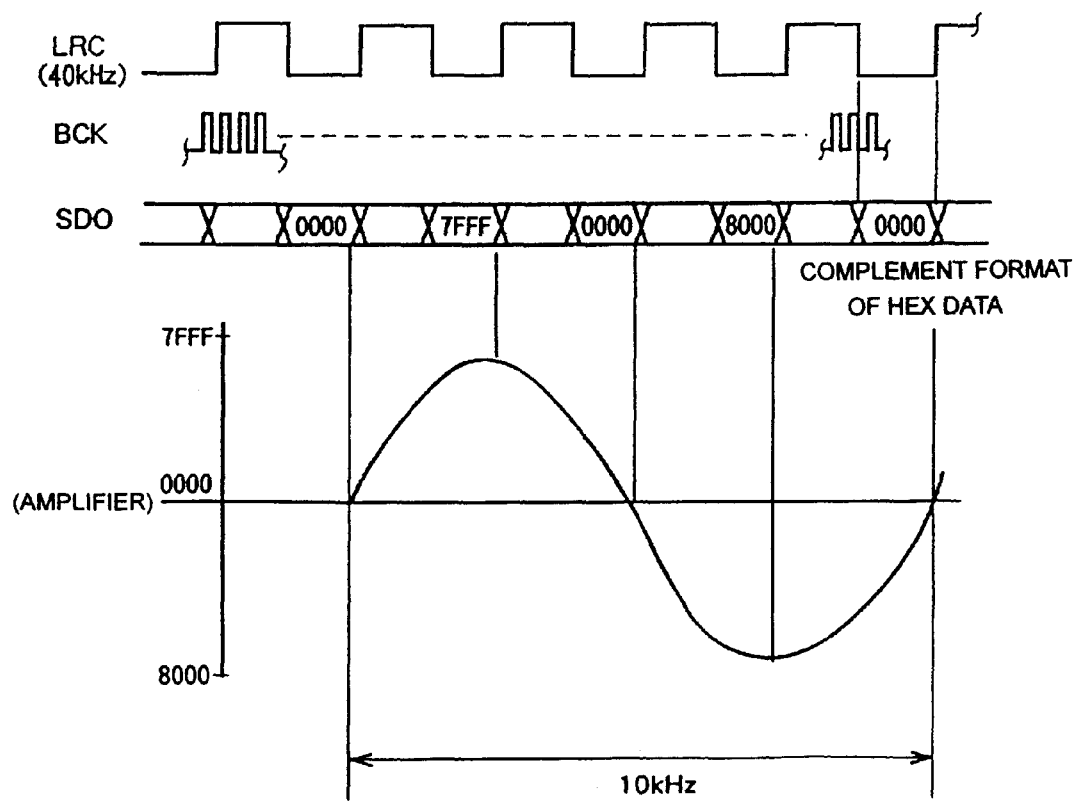
FIG. 3 is a view showing operation timing of a DA converter of FIG. 1.

FIG. 3 shows timing when sine-wave data for excitation of the resolver are inputted to the DA converter 11. The sampling frequency is set 40 KHz, and the serial data SDO are inputted to the DA converter 11 so that a sine wave of 10 KHz is obtained. The output of the DA converter 11 (sine wave for excitation of the resolver) is inputted to the amplifier 12 and is amplified so that a winding output voltage (sine-wave output and cosine-wave output) of the resolver comes to have a suitable value, and is supplied to the resolver as the sine wave for excitation. In response to this, the sine-wave output and cosine-wave output of the resolver are taken in the FPGA 13.

At this time, when the sine-wave for excitation of the resolver has, for example, a positive (or negative) maximum value (corresponding to a specific phase time of this invention. Incidentally, another angle such as 23° or 75° may be made a specific phase.), the AD converter 10 makes AD conversion of the sine-wave output and cosine-wave output of the resolver, and the AD conversion value is taken in the FPGA 13. Like this, if the AD conversion value is taken in the FPGA 13 when the sine-wave for excitation of the resolver has the positive (or negative) maximum value, sin ω t of the equation (5) can be regarded as a constant, and the equation (5) becomes sin (θ−φ)

That is, since the equation (5) is calculated by using the AD conversion value at the time of the positive or negative maximum value, the sampling frequency set at 40 KHz becomes 10 KHz.

The sine-wave and cosine-wave table writes into the data ROM 14 values of 16 bits of sine and cosine to an angle [address of the data ROM 14 (address of the table)] obtained by dividing 360° angular space of the resolver into 4096 (12 bits) equal parts.

The polarity of the AD conversion value of the sine-wave and cosine-wave output of the resolver is checked, so that the present position (present shaft angle) of the rotor of the resolver is judged.

Figure 4:
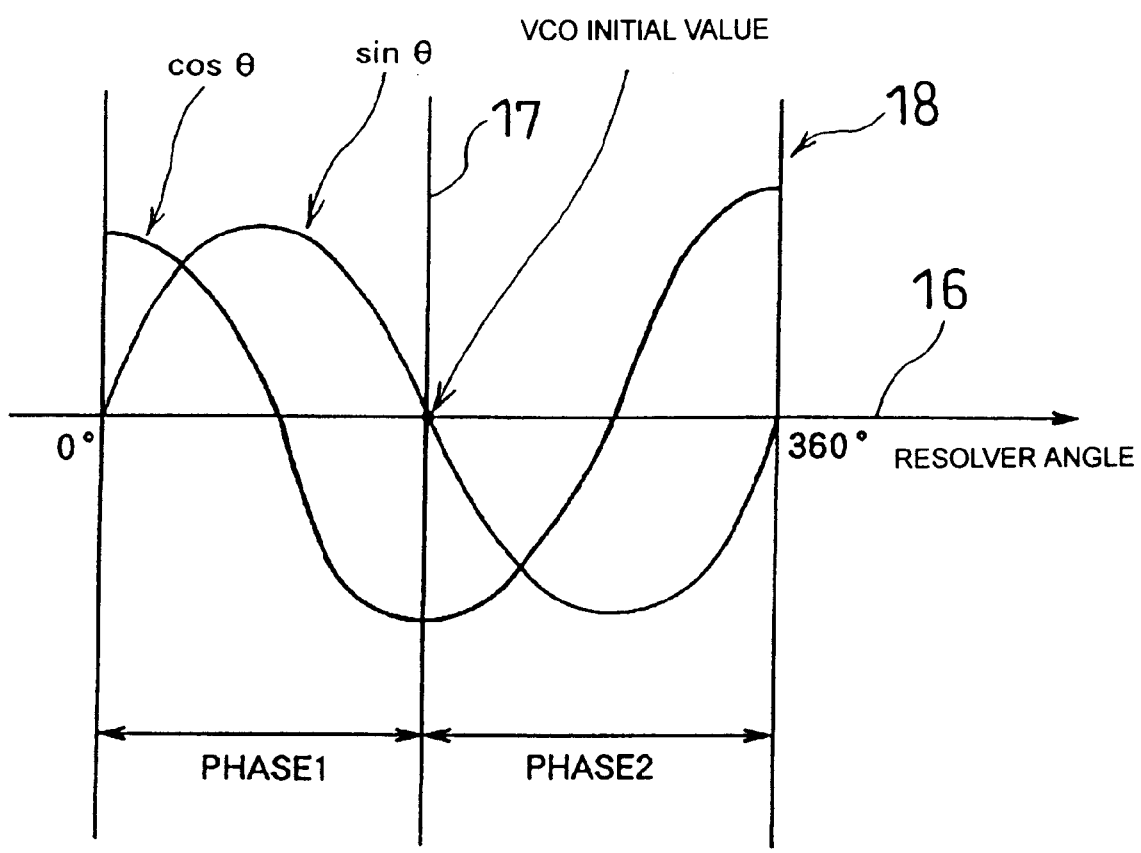
FIG. 4 is a view showing an angle of a resolver and an initial value of a VCO (sine-wave table).
Figure 5:
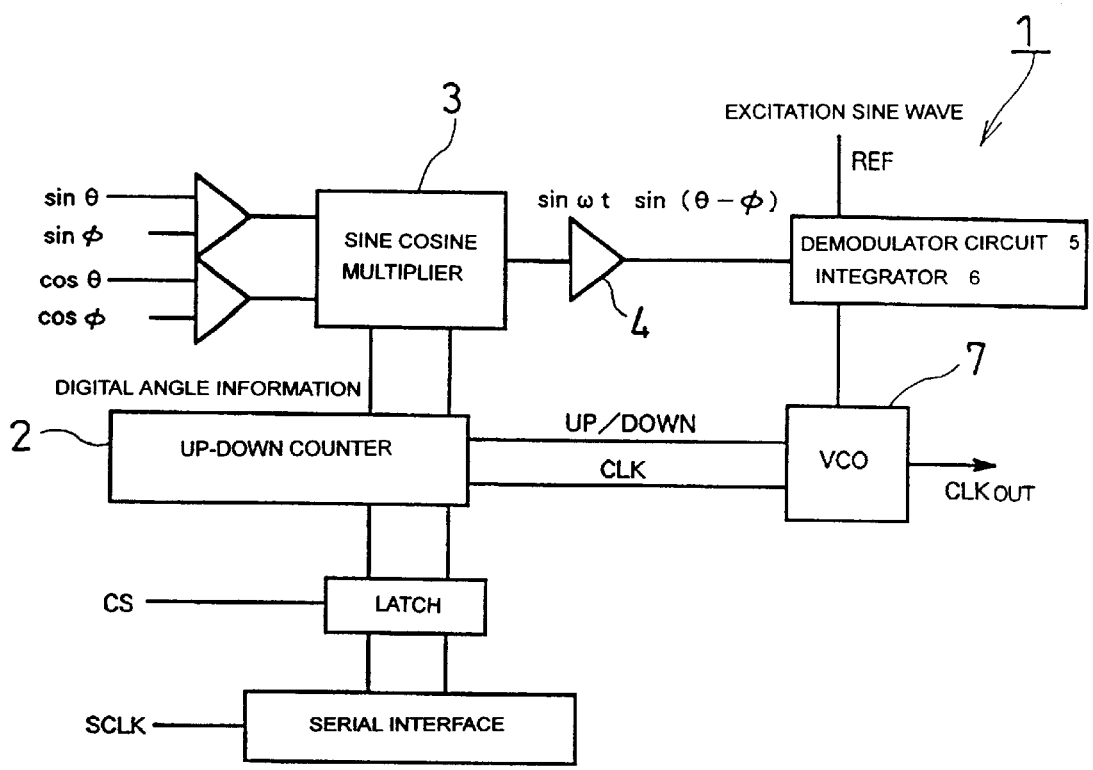
FIG. 5 is a block diagram showing an example of a conventional R/D converter.

As shown in FIG. 4, the 360° angular space is divided into two parts, and the part of 0–180° is made PHASE 1, and the part of 180–360° is made PHASE 2. That is, as shown in FIG. 4, a quadrant 18 is set by a horizontal axis 16 along which an angle value becomes large from 0° to 360° toward the right from the left, and a vertical axis 17 (corresponding to an initial position of an address of a sine-wave table described later) indicating an angle value of 180°. The left (0–180°) of the vertical axis 17 is made the PHASE 1, and the right (180–360°) of the vertical axis 17 is made the PHASE 2. An initial angle (address of the sine-wave table) [angle=φ] of a rotor shaft angle calculating for VCO (sine-wave table) is set at the center (vertical axis 17 indicating 180°) of the angular space (quadrant 18) of the resolver.

Next, angle displacement Δθ is calculated as Δθ =sin θ cosφ−cos θ sinφ=sin(θ−φ) [see equation (5)].

Here, by checking the polarity of the angle displacements Δθ, size relation between the rotor shaft angle θ of the resolver and the angle φ of the rotor shaft angle for calculating VCO [the rotor shaft angle for calculating VCO (sine-wave table) functions similarly to the voltage controlled oscillator (VCO) 7, and is hereinafter referred to as VCO for convenience] becomes apparent.

That is, when the angle displacement Δθ>0 is realized, the angle φ of the VCO is smaller than the rotor shaft angle θ. When the angle displacement Δθ<0 is realized, the angle φ of the VCO is larger than the rotor shaft angle θ.

Thus, based on the size relation, the address of the VCO (sine-wave table) is made to increase or decrease (increment or decrement) by one LSB.

For example, in the case where the rotor shaft angle θ exists in the PHASE 1 (0–180°), the address of the VCO (sine-wave table) is made to increase or decrease as follows.

That is, when the angle displacement Δθ<0 is realized, the angle θ of the VCO is larger than the rotor shaft angle θ (in the quadrant 18, the rotor shaft angle θ exists left as compared with the angle φ of the VCO), so that the address of the VCO (sine-wave table) is made to decrement by one LSB, and the address of the VCO (sine-wave table) is made to decrement until the angle displacements Δθ=0 is realized. When the angle displacements Δθ=0 is realized in the foregoing angle calculation of the FPGA 13, the angle φ of the VCO is equal to the rotor shaft angle θ, so that the AD converter 10 outputs the address of the VCO (sine-wave table) to the serial port of the FPGA 13.

In the case where the rotor shaft angle θ exists in the PHASE 2 (180–360°), the address of the VCO (sine-wave table) is made to increase or decrease as follows.

That is, when the angle displacement Δθ>0 is realized, the angle φ of the VCO is smaller than the rotor shaft angle θ (in the quadrant 18, the rotor shaft angle θ exists right as compared with the angle φ of the VCO), so that the address of the VCO (sine-wave table) is made to increment by one LSB, and the address of the VCO (sine-wave table) is made to increment until the angle displacements Δθ=0 is realized. When the angle displacements Δθ=0 is realized in the foregoing angle calculation of the FPGA 13, the angle of the VCO is equal to the rotor shaft angle, so that the AD converter 10 outputs the address of the VCO (sine-wave table) to the serial port of the FPGA 13. As described above, since the address of the VCO (sine-wave table) is made to increase or decrease (increment or decrement) based on the size relation between the angle φ of the VCO and the rotor shaft angle θ, position setting (position judgement) with high precision can be made.

As described above, in this embodiment, the rotor shaft angle of the resolver is calculated by the gate array (FPGA 13) having logical operation capability. As compared with the prior art (R/D converter 1 of the tracking system) for performing a kind of PLL control including the close loop made up of the demodulator circuit 5, the voltage controlled oscillator (VCO 7), and the like, it becomes possible to perform the rotor shaft angle calculation at higher speed, and the response speed can be improved by this. For example, although the tracking rate due to the PLL control is about 375 rps in the conventional tracking system R/D converter 1, the tracking rate can be improved according to this embodiment, and for example, it can be made 610 rps. Besides, even in the case where high resolution is made, high speed response can be maintained.

Besides, when the sine wave for excitation of the resolver has the positive (or negative) maximum value, the AD converter 10 performs AD conversion of the sine-wave output and cosine-wave output of the resolver, so that the demodulator circuit 5 which has been required in the foregoing prior art becomes unnecessary. Thus, the response speed can be further improved by the omission of the operation of the demodulator circuit as compared with the prior art.

When the sine wave for excitation of the resolver has the positive (or negative) maximum value, the AD converter 10 performs the AD conversion of the sine-wave output and cosine-wave output of the resolver, so that the sine wave for excitation can be regarded as a constant. Thus, it is possible to eliminate an increase of an angle error due to a positional shift between the excitation sine wave and the sine-wave output and cosine-wave output of the resolver, and even if an interface cable between the resolver and the R/D converter 1 becomes long, the angle error can be made small.

Besides, the FPGA 13 is provided between the AD converter 10 and the DA converter 11, makes calculation on the basis of digital values of the sine-wave output and cosine-wave output of the resolver inputted through the AD converter 10, and outputs an obtained digital value to the DA converter 11 and the like. Since the FPGA performs the digital operation of rotor shaft angle calculation, a compensation circuit of temperature drift which has been required in the prior art becomes unnecessary, and by this, the total structure becomes simple, and the cost can be made low. Besides, a comparatively inexpensive digital IC can be used for the FPGA 13, and by this, the cost of the whole apparatus can be further made low.

Incidentally, since the resolution of the rotor shaft angle is 12 bits, it is satisfactory if the precision of sin and cos values of the AD converter 10, and the sine-wave and cosine-wave table is 12 bits or more.

As described above, the present invention has the following effects.

That is, according to the first aspect of the invention, the gate array calculates the rotor shaft angle of the resolver, and as compared with the prior art (resolver of the tracking system) for performing a kind of PLL control including the close loop made up of the demodulator circuit, the voltage controlled oscillator (VCO), and the like, it becomes possible to perform the rotor shaft angle calculation at higher speed, and the response speed can be improved by this.

Besides, the gate array obtains the rotor shaft angle by digital operation, so that a compensation circuit of temperature drift which has been required in the prior art becomes unnecessary, and by this, the total structure becomes simple, and the cost can be made low. Besides, a comparatively inexpensive digital IC can be used for the gate array, and by this, the cost of the whole apparatus can be further made low.

According to the second aspect of the invention, such a structure can be made that at a specific phase time of the sine wave for excitation of the resolver, the sine-wave output signal and cosine-wave output signal of the resolver are subjected to AD conversion and are inputted to the gate array. By this, the demodulator circuit which has been required in the prior art becomes unnecessary, and as compared with the prior art, the response speed can be further improved by the omission of the calculation of the demodulator circuit.

According to the third aspect of the invention, at a specific phase of the sine wave for excitation of the resolver, the sine-wave output signal and cosine-wave output signal of the resolver are subjected to AD conversion, and the rotor shaft angle is calculated, so that the demodulator circuit which has been required in the prior art becomes unnecessary. Thus, as compared with the prior art, the response speed can be further improved by the omission of the calculation of the demodulator circuit. Further, when the sine wave for excitation of the resolver has the positive (or negative) maximum value, the sine-wave output and cosine-wave output of the resolver are subjected to AD conversion, and the sine wave for excitation can be regarded as a constant. Thus, it is possible to eliminate an increase of an angle error due to a positional shift between the excitation sine wave and the sine-wave output and cosine-wave output of the resolver, and even if an interface cable between the resolver and the R/D converter becomes long, the angle error can be made small.

According to the fourth aspect of the invention, the angle of the VCO is made to correspond to the rotor shaft angle and it becomes possible to recognize the size relation between both. By increasing or decreasing an address of, for example, the VCO (sine-wave table) by each bit according to the size relation of both, position setting (position judgement) with high precision can be made.

According to the fifth aspect of the invention, it becomes possible to increase or decrease the address of the VCO (sine-wave table) by each bit according to the size relation between the angle of the VCO and the angle of the rotor shaft, and by this, position setting (position judgement) with high precision can be made.

According to the sixth aspect of the invention, when the rotor shaft angle of the resolver in a quadrant exists right as compared with the angle of the VCO, the address value of the VCO (sine-wave table) is made to increment, so that the precision of position setting (position judgement) can be improved.

According to the seventh aspect of the invention, when the rotor shaft angle of the resolver in the quadrant exists left as compared with the angle of the VCO, the address value of the VCO (sine-wave table) is made to decrement, so that the precision of position setting (position judgement) can be improved.

According to the eighth aspect of the invention, the AD conversion value of the sine-wave output of the resolver and the sine value of the angle of the VCO are compared with each other, the address of the VCO (sine-wave table) is increased or decreased by one bit according to a quadrant of the rotor shaft angle, and an angle corresponding to the address of the VCO (sine-wave table) is made to approach the value corresponding to the rotor shaft angle. Accordingly, the precision of position setting (position judgement) can be improved.

What is claimed is:

1. An R/D converter, comprising:

a gate array to which data obtained through AD conversion of sine-wave output and cosine-wave output of a resolver are inputted and has logical operation capability, wherein the gate array obtains a rotor shaft angle of the resolver by digital operation on the basis of the digital input data, and wherein a quadrant formed by dividing an angular space of the resolver into two equal parts is obtained, the rotor shaft angle of the resolver in the quadrant is obtained on the basis of polarities of the sine-wave output and the cosine-wave output of the resolver, and an initial angle of a rotor shaft angle for calculating VCO is set at a center of the divided quadrant.

2. An R/D converter according to claim 1, wherein the gate array inputs digital data for an excitation sine wave of resolver to a DA converter, and the DA converter obtains the excitation sine wave of the resolver on the basis of the input data from the gate array.

3. An R/D converter according to claim 2, wherein at a specific phase time of the excitation sine wave of the resolver, a sine-wave output signal and a cosine-wave output signal of the resolver are subjected to AD conversion, and the rotor shaft angle is calculated.

4. An R/D converter according to claim 1, wherein a sine value corresponding to a difference between the rotor shaft angle of the resolver and an angle corresponding to an address of a sine-wave table is calculated, and an angle of the VCO is increased or decreased on the basis of size relation between the rotor shaft angle of the resolver and the angle of the VCO.

5. An R/D converter according to claim 4, wherein the quadrant is set such that a value in the angular space becomes large from the left to the right, and in the quadrant, if the rotor shaft angle of the resolver exists right as compared with the angle of the VCO, the angle of the VCO is made to increment.

6. An R/D converter according to claim 4, wherein the quadrant is set such that a value in the angular space becomes large from the left to the right, and in the quadrant, if the rotor shaft angle of the resolver exists left as compared with the angle of the VCO, the angle of the VCO is made to decrement.

7. An R/D converter according to claim 4, wherein an AD conversion value of the sine-wave output of the resolver and a sine value of the angle of the VCO are compared with each other, an address corresponding to an angle of the sine-wave table is increased or decreased by one bit according to the rotor shaft angle in the quadrant, and an angle corresponding to the address is made to approach the rotor shaft angle.

* * * * *